(12) United States Patent
Srivastava

(10) Patent No.: US 10,284,199 B2
(45) Date of Patent: *May 7, 2019

(54) VOLTAGE TOLERANT TERMINATION PRESENCE DETECTION

(71) Applicant: Intel Corporation, Santa Clara, CA (US)

(72) Inventor: Amit Kumar Srivastava, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/722,985

(22) Filed: Oct. 2, 2017

(65) Prior Publication Data

US 2018/0123589 A1 May 3, 2018

Related U.S. Application Data

(63) Continuation of application No. 15/087,462, filed on Mar. 31, 2016, now Pat. No. 9,780,783.

(51) Int. Cl.
    *H03K 17/16* (2006.01)
    *H03K 19/003* (2006.01)
    (Continued)

(52) U.S. Cl.
    CPC ..... *H03K 19/0005* (2013.01); *G06F 13/4086* (2013.01); *H03K 19/017509* (2013.01); *G06F 13/4072* (2013.01)

(58) Field of Classification Search
    None
    See application file for complete search history.

(56) References Cited

U.S. PATENT DOCUMENTS

| 5,898,232 A | 4/1999 | Reents et al. |
| 8,683,085 B1 | 3/2014 | Castleberry et al. |

(Continued)

FOREIGN PATENT DOCUMENTS

| JP | 10269780 A | 9/1998 |
| WO | 2011028388 A1 | 3/2011 |
| WO | 2013101479 A1 | 7/2013 |

OTHER PUBLICATIONS

"Universal Serial Bus Type-C Cable and Connector Specification", Hewlett-Packard Development Company, [Online], Retrieved from the Internet: <URL: http://ww,those.ch/designtechnik/wp-content/uploads/2014/USB-Type-CSpecification-Release-1.0pdf>, (Aug. 11, 2014), p. 13-p. 163.*
Non-Final Office Action dated Sep. 9, 2015 for U.S. Appl. No. 14/483,649, 7 pages.
International Search Report and Written Opinion dated Oct. 27, 2015 for PCT Application No. PCT/US2015/043835, 10 pages.
Final Office Action dated Jan. 13, 2016 for U.S. Appl. No. 14/483,649, 8 pages.

(Continued)

*Primary Examiner* — Anh Q Tran
(74) *Attorney, Agent, or Firm* — Schwabe, Williamson & Wyatt, P.C.

(57) ABSTRACT

Apparatuses and methods associated with voltage tolerant termination presence detection for universal serial bus type-C connectors are disclosed herein. In embodiments, an apparatus to enable voltage tolerant termination presence detection may include sensor circuitry to determine whether a device coupled to the sensor circuitry is to operate in host mode or device mode based on a signal on a configuration channel between the device and the sensor circuitry. In embodiments, the apparatus may further include termination circuitry to bias the configuration channel in accordance with the host mode or the device mode based on the determination of whether the device is to operate in the host mode or the device mode. Other embodiments may be described and/or claimed.

20 Claims, 10 Drawing Sheets

(51) Int. Cl.
  *H03K 19/00*     (2006.01)
  *H03K 19/0175*   (2006.01)
  *G06F 13/40*     (2006.01)

(56) References Cited

U.S. PATENT DOCUMENTS

| | | | |
|---|---|---|---|
| 9,400,546 B1* | 7/2016 | Agarwal | ............... G06F 1/3287 |
| 9,780,783 B1* | 10/2017 | Srivastava | ......... H03K 19/0005 |
| 2003/0142707 A1 | 7/2003 | Baumgartner | |
| 2004/0263214 A1 | 12/2004 | Patterson | |
| 2005/0156038 A1 | 7/2005 | Wurzburg et al. | |
| 2008/0215904 A1 | 9/2008 | Tsuji | |
| 2009/0248930 A1 | 10/2009 | Garlapati et al. | |
| 2011/0043162 A1 | 2/2011 | Lee et al. | |
| 2011/0145445 A1 | 7/2011 | Malamant et al. | |
| 2012/0099675 A1 | 4/2012 | Kitamura et al. | |
| 2013/0094538 A1 | 4/2013 | Wang | |
| 2013/0113446 A1 | 5/2013 | De Haas | |
| 2013/0335865 A1 | 12/2013 | Kim | |
| 2015/0253842 A1 | 9/2015 | Murata | |
| 2015/0268688 A1* | 9/2015 | Leinonen | ................... G05F 3/02 |
| | | | 307/147 |
| 2016/0079747 A1 | 3/2016 | Srivastava et al. | |

OTHER PUBLICATIONS

Non-Final Office Action dated May 13, 2016 for U.S. Appl. No. 14/483,649, 9 pages.

Final Office Action dated Aug. 24, 2016 for U.S. Appl. No. 14/483,649, 10 pages.

Notice of Allowance dated Nov. 16, 2016 for U.S. Appl. No. 14/483,649, 9 pages.

International Search Report and Written Opinion dated May 24, 2017 for International Application No. PCT/US2017/019919, 16 pages.

"Universal Serial Bus Type-C Cable and Connector Specification" Hewlett-Packard Development Company, [Online] Retrieved from the Internet: <URL: http://ww,those.ch/designtechnik/wp-content/uploads/2014/08/USB-Type-CSpecification- Release-1.0.pdf>, (Aug. 11, 2014), p. 13-p. 163.

Non-Final Office Action dated Oct. 14, 2016 for U.S. Appl. No. 15/087,462, 14 pages.

Notice of Allowance dated May 19, 2017 for U.S. Appl. No. 15/087,462, 13 pages.

* cited by examiner

VOLTAGE TOLERANT TERMINATION PRESENCE DETECTION

The present application is a continuation of U.S. patent application Ser. No. 15/087,462, filed Mar. 31, 2016, entitled "VOLTAGE TOLERANT TERMINATION PRESENCE DETECTION," the entire disclosure of which is hereby incorporated by reference in its entirety.

TECHNICAL FIELD

The present disclosure relates to the field of electronic circuits. More particularly, the present disclosure relates to voltage tolerant termination presence detection.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

The type-C universal serial bus (USB) connector has developed as a new form factor connector for devices coupled to a computing device. The type-C USB connector operates as an all-in-one connector allowing for various types of communications with the devices, such as USB communication, peripheral component interconnect (PCI) communication and display communication.

Additionally, the type-C USB connector is compatible with dual role devices, which may operate in either a host mode or a device mode at different instances depending on circumstances associated with the devices and/or the computing device. Determination of whether a device coupled to the computing device is to operate in the host mode or the device mode may be determined based on information communicated across a configuration channel (CC). Legacy apparatuses performed operations for determining whether the device is to operate in the host mode or device mode through a port chip separate from a system-on-chip (SOC) having the physical layer for the type-C connector.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
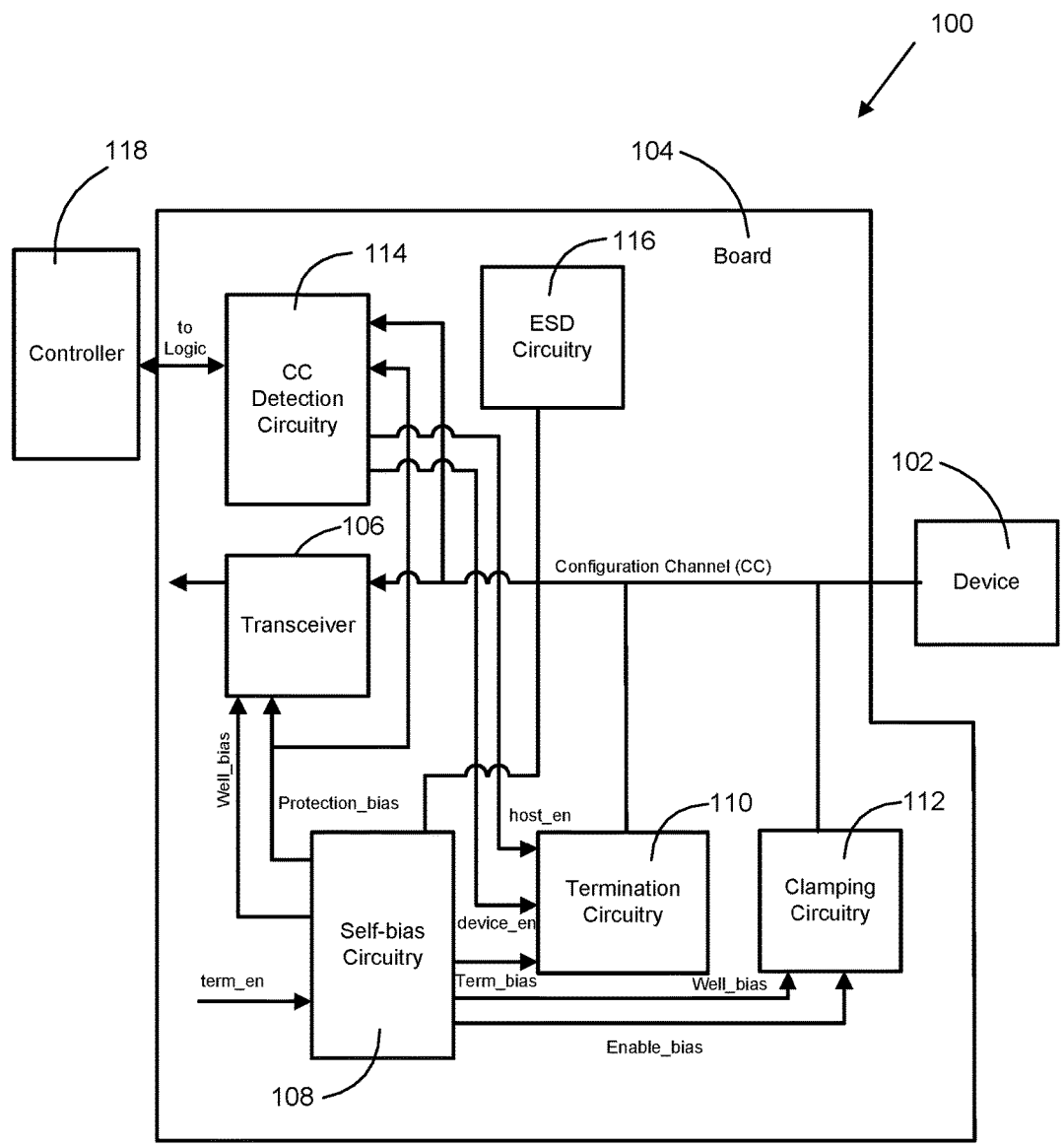
FIG. 1 illustrates an example system configuration that includes voltage tolerant presence detection, according to various embodiments.

Apparatuses and methods associated with voltage tolerant termination presence detection for universal serial bus type-C connectors are disclosed herein. In embodiments, an apparatus to enable voltage tolerant termination presence detection may include sensor circuitry to determine whether a device coupled to the sensor circuitry is to operate in host mode or device mode based on a signal on a configuration channel between the device and the sensor circuitry. The apparatus may further include termination circuitry to bias the configuration channel in accordance with the host mode or the device mode based on the determination of whether the device is to operate in the host mode or the device mode.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example system configuration 100 that includes voltage tolerant presence detection, according to various embodiments. The system configuration 100 may include a device 102 communicatively coupled to board 104. The device 102 may be a cellular phone, a laptop, a tablet device, some other type of computing device, or some combination thereof. The device 102 may be a dual-role device, which may operate in a host mode and/or a device mode based on a condition of the system configuration 100. In the host mode, the device 102 may initiate communications across a USB connection. In the device mode, the device 102 may be passive, thereby following communication from the board 104 and/or components thereon, and may be charged by one or more of the components on the board 104 and/or a power supply.

The device 102 may be coupled to the board 104 by a type-C USB connector. The device 102 may communicate with components located on the board through the type-C USB connector and/or may be charged by the components located on the board through the type-C USB connector. The type-C USB connector may include a configuration channel (CC) pin to convey a signal on a configuration channel from the device 102 to one or more components located on the board 104.

The board 104 may be a circuit board within a computing device, such as a motherboard, a peripheral component interconnect (PCI) card, a sound card, a video card, or some combination thereof. In some embodiments, the board 104 may include more than one circuit board within a computing device and components illustrated on the board 104 may be located on a single circuit board or may be located on multiple different circuit boards. In some embodiments, all, or at least a portion, of the components illustrated on the board 104 may be located within a system-on-a-chip (SOC) and/or within a die located on the board 104. In some embodiments, the self-bias circuitry 108, termination circuitry 110 and clamping circuitry may be located within an SOC and/or within a die located on the board 104. The board 104 may include a port to accept the type-C USB connector from the device 102.

A transceiver 106 may be located on the board 104. The transceiver 106 may receive communications from the device 102 and, in turn, transmit the communications, or other communications associated with the communications from the device 102, to other components on the board 104, to other boards within a computing device including the transceiver 106, to other computing devices linked across a network (such as via the internet, wireless communication systems, or other known communication networks for communicating between computing devices), or some combination thereof.

The system configuration 100 may include self-bias circuitry 108. The self-bias circuitry 108 may be located on the board 104. The self-bias circuitry 108 may receive power from the device 102 and/or a power supply and may generate biasing signals for components located on the board 104, including the transceiver 106, termination circuitry 110, clamping circuitry 112, CC detection circuitry 114, electrostatic discharge (ESD) circuitry 116, or some combination thereof. The biasing signals generated by the self-bias circuitry 108 may be based on operational values and/or maximum operational values for the components located on the board 104, a condition of the components located on the board 104, a condition of the device 102, or some combination thereof. The self-bias circuitry 108 may generate one or more biasing signals for maintaining one or more of the components on the board 104 in a particular state, such as a logic high level and/or a logic low level.

The CC detection circuitry 114 may determine whether the device 102 is to operate in the host mode or the device mode. The CC detection circuitry 114 may be coupled to a controller 118, wherein the controller 118 may provide a host signal and/or a device signal to the CC detection circuitry 114. The CC detection circuitry 114 may sense a signal on the CC and determine whether the device 102 is to operate in the host mode or the device mode based on the signal and/or the host signal or the device signal received from the controller 118. In some embodiments, the CC detection circuitry 114 may detect the voltage of the signal on the CC and determine whether the device is to operate in the host mode or the device mode based on the voltage.

Based on the determination of whether the device 102 is to operate in host mode or device mode, the self-bias circuitry 108 may receive an indication from the CC detection circuitry 114 associated with host enable signal or device enable signal to indicate that the device 102 is to operate in the host mode or the device mode. The indication may further be transmitted to the termination circuitry 110. For example, the CC detection circuitry 114 may set the host enable signal to a logic high level to indicate that the device 102 is to operate in host mode and may set the device enable signal to a logic high level to indicate that the device 102 is to operate in device mode. The device enable signal may have a logic low level when the host enable signal has a logic high level to indicate that the device 102 is to operate in host mode, and the host enable signal may have a logic low level when the device enable signal has a logic high level to indicate that the device 102 is to operate in the device mode. In some embodiments, the host enable signal and/or device enable signals may be pulse signals that go to the logic high level for a period of time (e.g., one or more clock cycles) to indicate the respective mode. In other embodiments, the self-bias circuitry 108 may pass a single enable signal to the termination circuitry 110, the single enable signal having a first logic value to indicate that the device 102 is to operate in the host mode or a second logic value to indicate that the device 102 is to operate in device mode.

The system configuration 100 may include the termination circuitry 110. The termination circuitry 110 may be located on the board 104. The termination circuitry 110 may receive the host enable signal, the device enable signal, a termination biasing signal, or some combination thereof, from the CC detection circuitry 114. Based on the signals received from the self-bias circuitry 108, or some portion thereof, the CC detection circuitry 114 may bias the configuration channel of the device in accordance with the host mode or the device mode of the device.

Biasing the configuration channel may include enabling pull-down circuitry within the termination circuitry 110 to set the configuration channel to a logic low level in response to receiving a device enable signal indicating that the device is to operate in device mode. The device enable signal may be in a logic high level to indicate that the device is to operate in the device mode. When in the device mode, the device 102 may be charged by components on the board 104 and/or by a power supply coupled to the device 102. In some embodiments, when in the device mode, the device 102 may start charging components on the board 104 and/or may utilize a power supply coupled to the device 102 to charge a batter of the board 104.

Biasing the configuration channel may further include enabling pull-up circuitry within the termination circuitry 110 to set the configuration channel to a logic high level in response to receiving a host enable signal indicating that the device is to operate in host mode. The host enable signal may be in a logic high level to indicate that the device is to operate in the host mode. When in the host mode, the device 102 may communicate with the components on the board 104.

The system configuration 100 may include clamping circuitry 112. The clamping circuitry 112 may be located on the board 104. The clamping circuitry 112 may sense a voltage of the CC from the device 102, and/or receive a signal indicating a voltage of the CC, and clamp the voltage at a maximum voltage. Clamping the voltage at the maximum voltage may prevent internal circuitry of the components on the board 104 and/or components coupled to the CC detection circuitry 114 and/or the transceiver 106 from experiencing the overstress condition (voltages greater than the maximum voltage). When the voltage of the CC is below the maximum voltage, the clamping circuitry 112 may be inactive and the voltage of the CC may be defined by the device 102.

When the voltage of the CC is greater than or equal to the maximum voltage, the clamping circuitry 112 may be enabled and may be to maintain the voltage of the CC at the defined maximum voltage, thereby preventing the voltage of the CC from being greater than the maximum voltage. When enabled, the clamping circuitry 112 may be to sink current from the configuration to maintain the maximum voltage on the CC. The amount of current to sink from the CC by the clamping circuitry 112 may be dependent on the voltage being transmitted on the CC by the device 102.

The maximum voltage to be maintained by the clamping circuitry 112 when the voltage of the CC from the device 102 is greater than or equal to the maximum voltage may be selected based on a maximum operational voltage of one or more of the components located on the board 104 that are coupled to the CC. The maximum voltage may be selected to be the maximum operational voltage or may be defined to be below the maximum operational voltage. In some embodiments, the maximum voltage may be selected to be 3.3 volts or 1.8 volts to correspond to the maximum operational voltage of the one or more of the components.

The system configuration 100 may include CC detection circuitry 114. The CC detection circuitry 114 may be located on the board 104. The CC detection circuitry 114 may detect a signal on the CC from the device 102. Based on the detection of the signal on the CC, the CC detection circuitry 114 may transmit a signal to logic within the computing device that includes the system configuration 100 indicating information provided on the CC. The information may include an indication of whether the device is to operate in the host mode or the device mode.

The system configuration 100 may include the ESD circuitry 116. The ESD circuitry 116 may be located on the board 104. The ESD circuitry 116 may include circuitry to protect electrical components from electrostatic discharge. The ESD circuitry 116 may be utilized for protecting any one or more of the components on the board 104 from electrostatic discharge, including the self-bias circuitry 108, the termination circuitry 110, the clamping circuitry 112, the transceiver 106, the CC detection circuitry 114, or some combination thereof.

Figure 2:
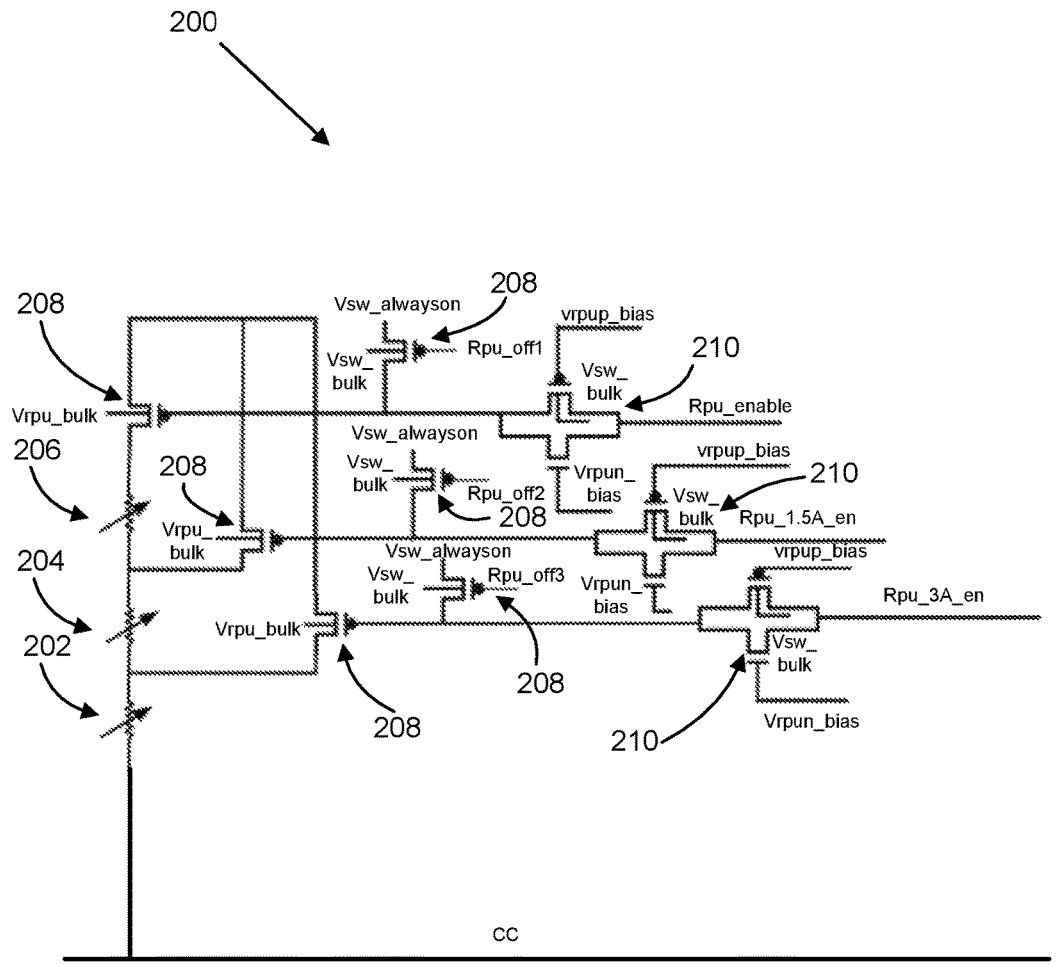
FIG. 2 illustrates an example of pull-up circuitry for voltage tolerant presence detection, according to various embodiments.

FIG. 2 illustrates an example of pull-up circuitry 200 for voltage tolerant presence detection, according to various embodiments. The pull-up circuitry 200 may be located in termination circuitry, such as the termination circuitry 110, and may be utilized for performance of one or more operations by the termination circuitry 110. The pull-up circuitry 200 may be utilized for setting a CC, such as the CC illustrated in FIG. 1, to a logic high level in response to determining that a device, such as the device 102 of FIG. 1, coupled to the pull-up circuitry 200 is to operate in host mode.

The pull-up circuitry 200 may include one or more resistors, including first resistor 202, second resistor 204 and third resistor 206, to couple the CC to circuitry and/or a power supply that provides a logic high level signal. In some embodiments, the resistors may be potentiometers, which may provide a variable amount of resistance. The resistors may provide different amounts of resistance, with the first resistor 202 providing the least amount of resistance, the second resistor 204 providing an intermediate amount of resistance and the third resistor 206 providing the greatest amount of resistance. In one example embodiment, the first resistor 202 may have a resistance of 4,700 ohms, the second resistor 204 may have a resistance of 7,300 ohms, and the third resistor 206 may have a resistance of 24,000 ohms. It will be apparent that other resistance values may be used in other embodiments.

When the pull-up circuitry 200 is enabled, some portion or all of the first resistor 202, the second resistor 204 and the third resistor 206 may be active. For example, at a certain moment the first resistor 202 and the second resistor 204 may be active (in circuit with the CC and with current running across the resistors), while the third resistor 206 may be inactive (not in circuit with the CC and without current running across the resistor).

The first resistor 202, the second resistor 204 and the third resistor 206 may each be activated and/or inactivated by one or more transistors. The one or more transistors may include plurality of transistors 210 and/or plurality of transistor pairs 212. Which resistors of the first resistor 202, the second resistor 204 and the third resistor 206 that are selected to be active during a time period may be determined based on one or more factors, such as a desired voltage to be on the CC during the time period, a desired current to be provided to the CC by the pull-up circuitry 200 during the time period, or some combination thereof.

It is to be understood that in some embodiments there may be more or less than the three resistors described in relation to the pull-up circuitry 200. Each of the resistors may be configured to be activated or inactivated by one or more transistors. In some embodiments, the resistors may be replaced and/or supplemented by other resistive elements. Further, in some embodiments, the transistors illustrated in the pull-up circuitry 200 may be replaced and/or supplemented by other switching elements, such as a physical switch, a magnetic switch, an optical switch, or some combination thereof.

Figure 3:
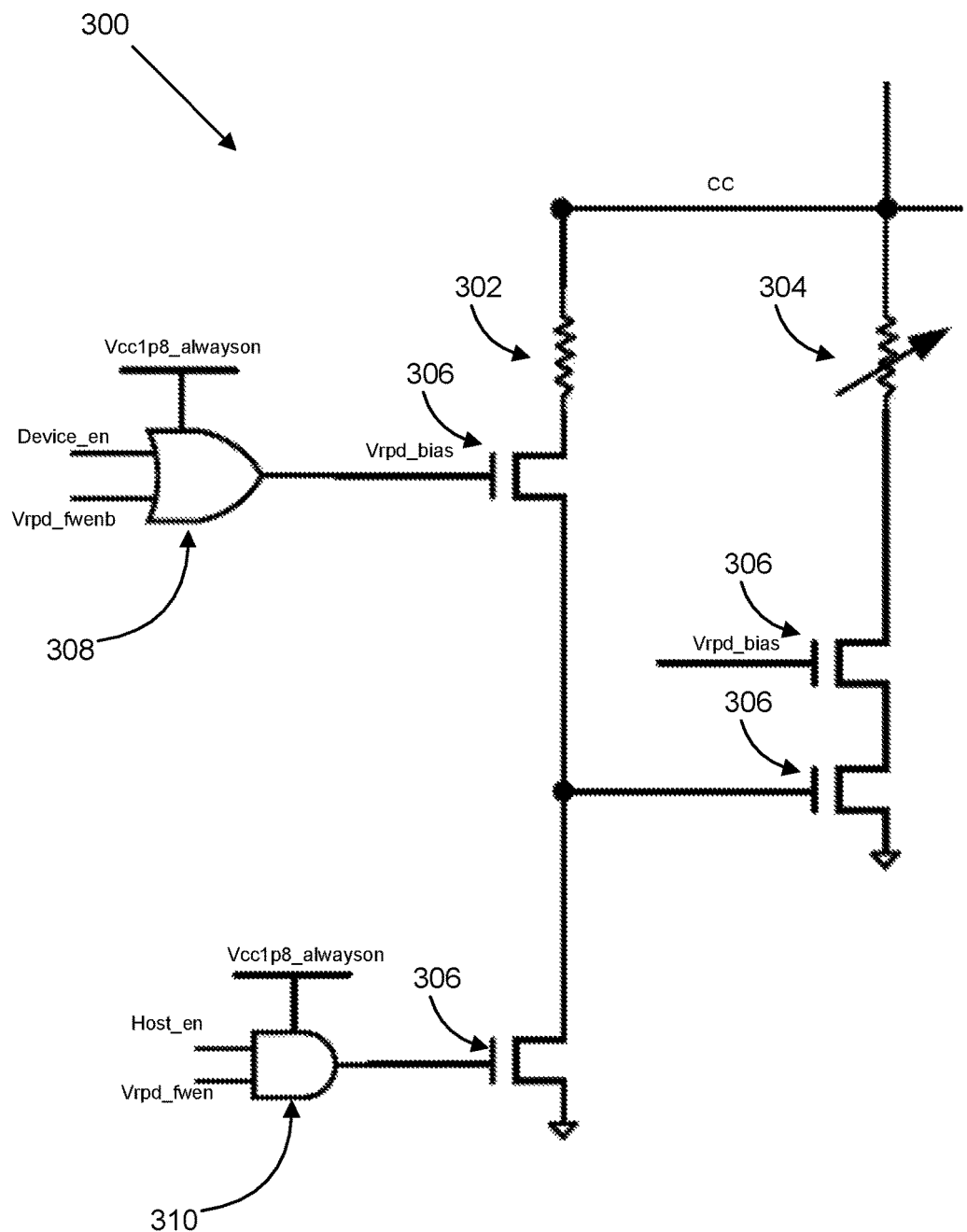
FIG. 3 illustrates an example of pull-down circuitry for voltage tolerant presence detection, according to various embodiments.

FIG. 3 illustrates an example of pull-down circuitry 300 for voltage tolerant presence detection, according to various embodiments. The pull-down circuitry 300 may be located in termination circuitry, such as the termination circuitry 110, and may be utilized for performance of one or more operations by the termination circuitry. The pull-down circuitry 300 may be utilized for setting a CC, such as the CC illustrated in FIG. 1, to a logic low level in response to determining that a device, such as the device 102 of FIG. 1, coupled to the pull-down circuitry 300 is to operate in device mode. In some embodiments, setting the CC to the logic low level may include coupling the CC to ground, either directly or through a resistive element.

The pull-down circuitry 300 may include one or more resistors, such as first resistor 302 and second resistor 304. The one or more resistors may be activated to couple the CC to circuitry and/or ground of a circuit including the pull-down circuitry 300 providing the logic low level. Any portion of the one or more resistors may be activated (in circuit with the CC and with current running across the resistors) and/or inactivated (out of circuit with the CC and without current running across the resistors) by one or more transistors. The one or more transistors may include transistors 306.

In some embodiments, the first resistor 302 and/or the second resistor 304 may be potentiometers, which may provide a variable amount of resistance. The first resistor 302 and the second resistor 304 may provide different amounts of resistance. In some embodiments, the first resistor 302 may provide a resistance amount of greater than 200,000 ohms and the second resistor 304 may provide a resistance amount of 5,100 ohms.

The pull-down circuitry 300 may include circuitry implementing logical constructs, such as AND logic, NAND logic, OR logic, NOR logic, exclusive OR logic, or some combination thereof. In some embodiments, the pull-down circuitry may receive a device enable signal and may process the device enable signal through circuitry implementing an OR logical construct 308. In response to receiving a device enable signal indicating that a device, such as the device 102 of FIG. 1, coupled to the pull-down circuitry 300 is to operate in device mode, the OR logical construct 308 may output a logic high level signal that enables the pull-down circuitry 300 to set the CC to the logic low level.

In some embodiments, the pull-down circuitry 300 may receive a host enable signal and may process the host enable signal through circuitry implementing an AND logical construct 310. In response to receiving a host enable signal indicating that a device, such as the device 102 of FIG. 1, coupled to the pull-down circuitry 300 is to operate in device mode, the AND logical construct 310 may output a logic high level signal that disables the pull-down circuitry 300 from setting the CC to the logic low level.

It is to be understood that in some embodiments there may be more or less than the two resistors described in relation to the pull-down circuitry 300. In some embodiments, the resistors may be replaced and/or supplemented by other resistive elements, such as capacitors, inductors, or some combination thereof. Further, in some embodiments, the transistors and/or the logical constructs may be replaced and/or supplemented by other switching elements, such as a physical switch, a magnetic switch, an optical switch, or some combination thereof.

Figure 4:
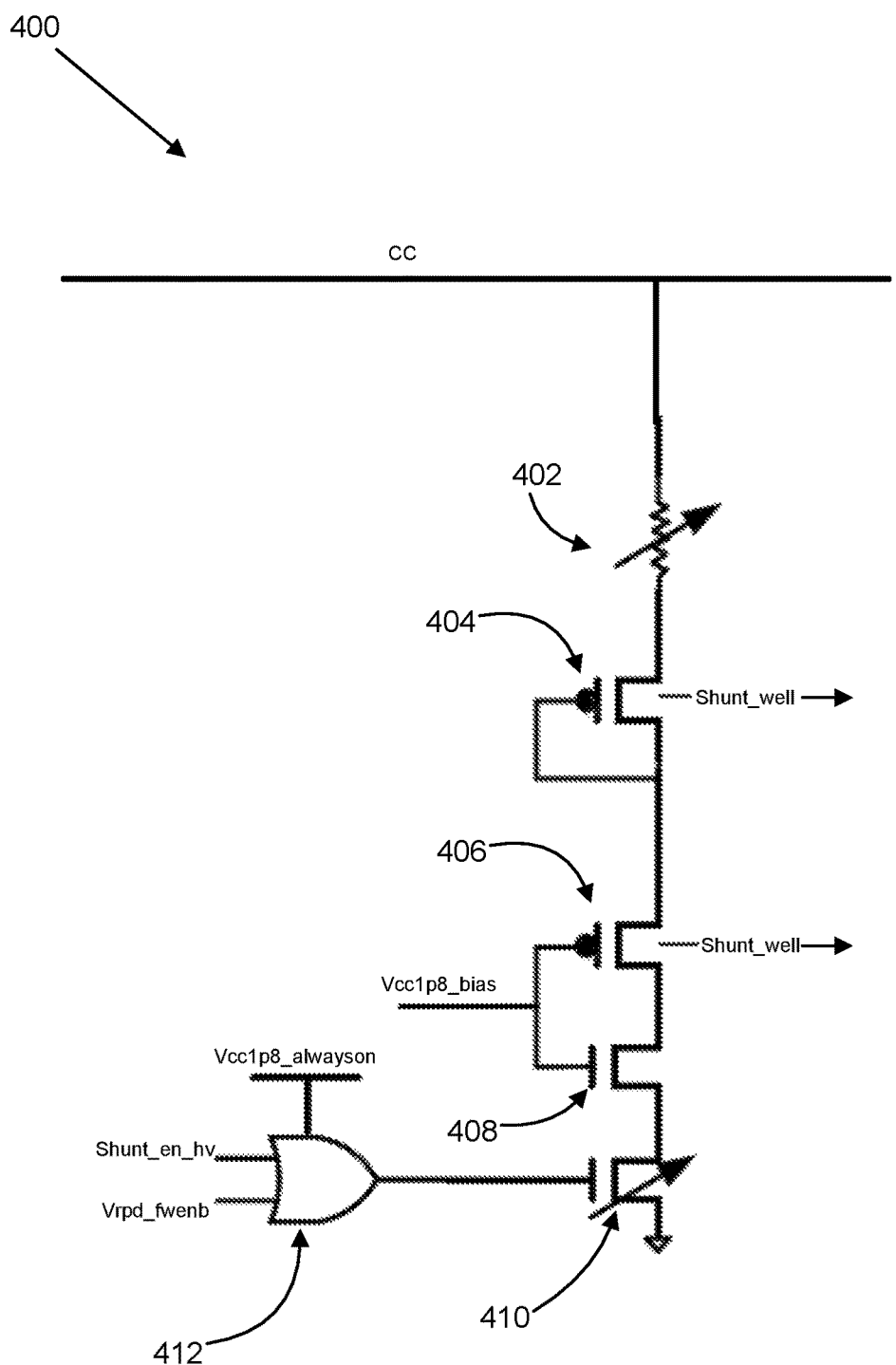
FIG. 4 illustrates an example of clamping circuitry for voltage tolerant presence detection, according to various embodiments.

FIG. 4 illustrates an example of clamping circuitry 400 for voltage tolerant presence detection, according to various embodiments. The clamping circuitry 400 may be included in or may be the clamping circuitry 112 of FIG. 1. The clamping circuitry 400 may be utilized to perform any of the operations described in relation to the clamping circuitry 112 and/or may include one or more of the features described in relation to the clamping circuitry 112.

The clamping circuitry 400 may include a resistor 402 to couple a CC, such as the CC illustrated in FIG. 1, to ground during a certain condition. The certain condition may be a condition when the CC is driven by a device, such as the device 102 of FIG. 1, to be equal to or exceed a maximum voltage. The device may enable the clamping circuitry. During the certain condition, the resistor 402 may be active (in circuit with the CC and with current across the resistor) and may be to sink current from the CC in order to maintain a voltage on the CC line to be equal to or below the maximum voltage. The maximum voltage may be selected based on a maximum operational voltage of a system and/or circuitry that includes the clamping circuitry 400. In some embodiments, the maximum voltage may be selected to be 1.8 volts or 3.3 volts.

The clamping circuitry 400 may include one or more transistors located between the resistor 402 and the ground. The one or more transistors may be switched to activate the resistor 402 or to deactivate the resistor 402. The one or more transistors may include first transistor 404, second transistor 406, third transistor 408 and/or fourth transistor 410. The second transistor 406 and the third transistor 408 may be utilized for protection from voltages greater than a defined maximum voltage. The fourth transistor 410 may enable resistor 402. Further, the resistor 402 may be a potentiometer and the fourth transistor 410 may configure the potentiometer.

The clamping circuitry 400 may receive a shunt enable signal. The clamping circuitry 400 may include circuitry to implement a logical construct, such as AND logic, NAND logic, OR logic, NOR logic, exclusive OR logic, or some combination thereof. In some embodiments, the clamping circuitry 400 may include circuitry implementing an OR logical construct 412 to process a shunt enable signal. In response to receiving the shunt enable signal indicating that the clamping circuitry 400 should be enabled, the transistor controlled by the shunt enable signal may be placed in an active state (conducting current) and may activate the resistor, thereby sinking current from the CC and maintaining a voltage on the CC of less than or equal to the maximum voltage.

It is to be understood that in some embodiments there may be more or less than the single resistor described in relation to the clamping circuitry 400. In some embodiments, the resistors may be replaced and/or supplemented by other resistive elements. Further, in some embodiments, the transistors and/or the logical constructs may be replaced and/or supplemented by other switching elements, such as a physical switch, a magnetic switch, an optical switch, or some combination thereof.

Figure 5:
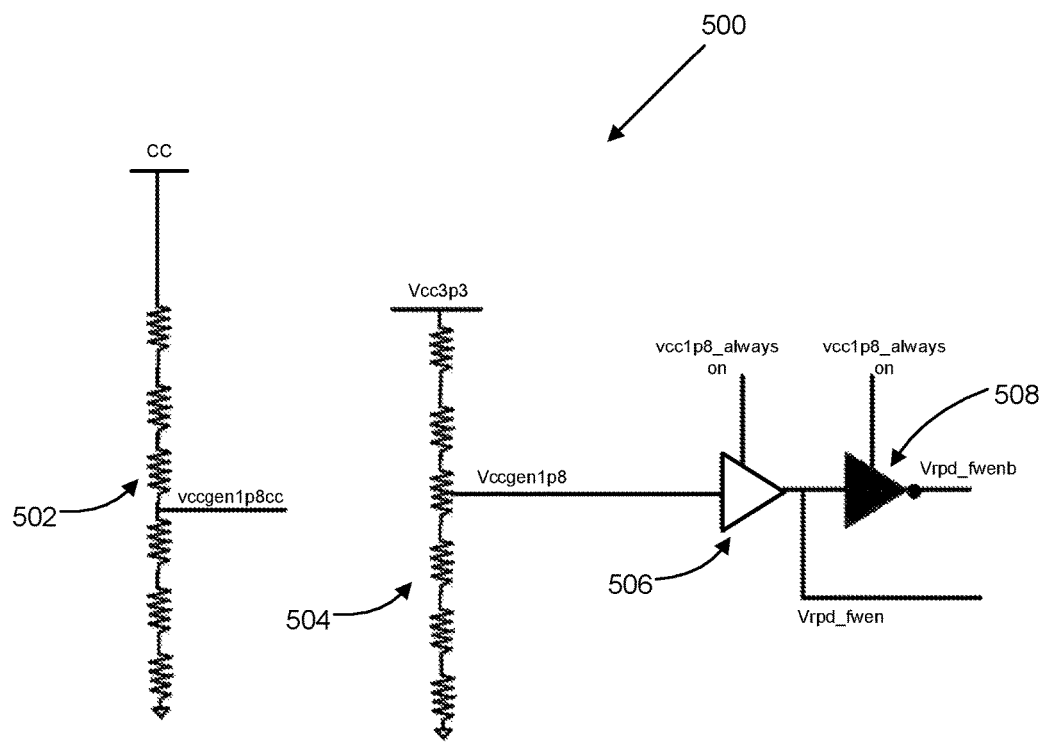
FIG. 5 illustrates an example of sensor circuitry for voltage tolerant presence detection, according to various embodiments.

FIG. 5 illustrates an example of sensor circuitry 500 for voltage tolerant presence detection, according to various embodiments. The sensor circuitry 500 may be located in self-bias circuitry, such as the self-bias circuitry 108 of FIG. 1, and may be utilized for performance of one or more operations by the self-bias circuitry 108.

The sensor circuitry 500 may be utilized for sensing a signal on the CC provided by the device. The sensor circuitry 500 may determine a voltage of the signal on the CC and output an indication of the voltage. The sensor circuitry 500 may include one or more resistors that provide a high impedance path from the CC to the point where the voltage of the signal is determined, such that there is not load variance in path with the CC. The one or more resistors may include a first set of resistors 502 and/or a second set of resistors 504.

The sensor circuitry 500 may include a buffer 506 and/or an inverter 508. The buffer 506 may buffer, filter and/or boost an output of the second set of resistors 504. The inverter 508 may invert the output of the buffer 506.

The indication may be transmitted to pull-up circuitry (such as the pull-up circuitry 200 of FIG. 2), pull-down circuitry (such as the pull-down circuitry 300 of FIG. 3), clamping circuitry (such as the clamping circuitry 112 of FIG. 1 and/or the clamping circuitry 400 of FIG. 4), termination circuitry (such as the termination circuitry 110 of FIG. 1), or some combination thereof. The pull-up circuitry, the pull-down circuitry, and/or the termination circuitry may utilize the indication of the voltage to determine whether the pull-up circuitry or the pull-down circuitry should be activated. The clamping circuitry may utilize the indication of the voltage to determine whether the voltage on the CC should be clamped at the maximum voltage.

Figure 6:
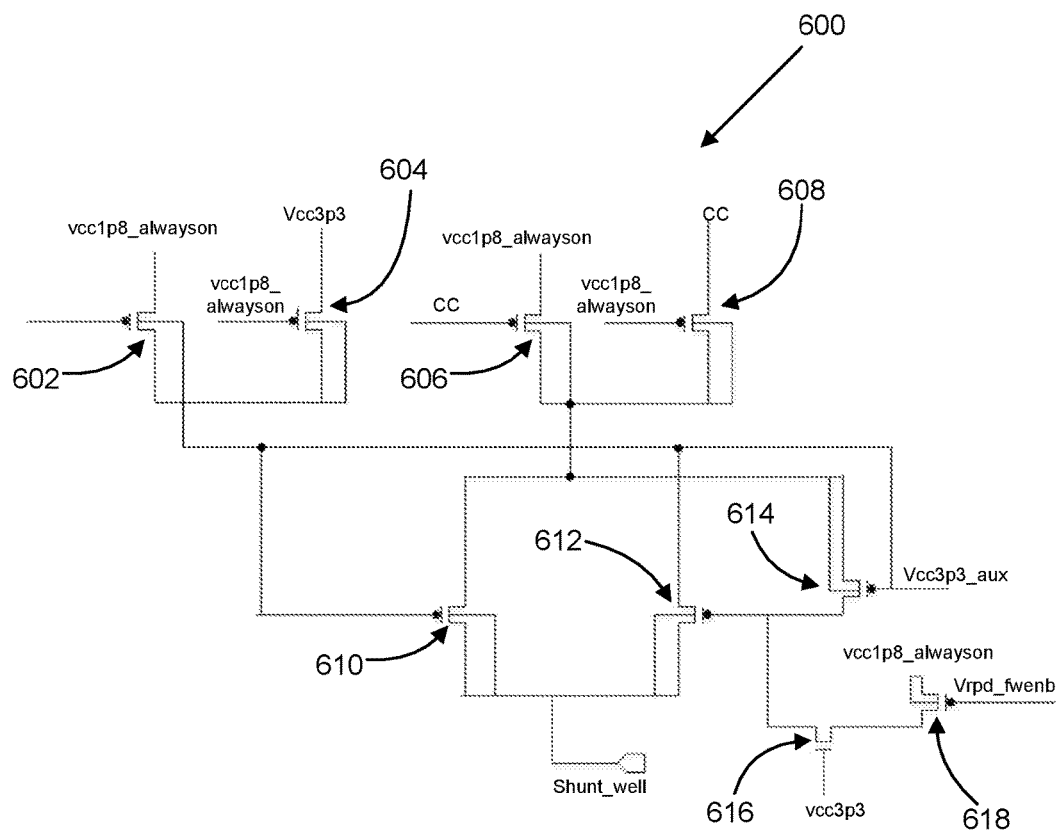
FIG. 6 illustrates an example of well bias circuitry for voltage tolerant presence detection, according to various embodiments.

FIG. 6 illustrates an example of well bias circuitry 600 for voltage tolerant presence detection, according to various embodiments. The well bias circuitry 600 may be located in self-bias circuitry, such as the self-bias circuitry 108 of FIG. 1, and may be utilized for performance of one or more operations by the self-bias circuitry 108.

The well bias circuitry 600 may be coupled to a power supply and/or the CC and may receive power from the power supply. The well bias circuitry 600 may generate one or more bias sources from the power received from the power supply and/or the CC. The one or more bias sources may be provided to a transceiver (such as the transceiver 106 of FIG. 1), a termination circuitry (such as the termination circuitry 110 of FIG. 1), a clamping circuitry (such as the clamping circuitry 112 of FIG. 1 and/or the clamping circuitry 400 of FIG. 4), CC detection circuitry (such as the CC detection circuitry 114 of FIG. 1), ESD circuitry (such as the ESD circuitry 116 of FIG. 1), pull-up circuitry (such as the pull-up circuitry 200 of FIG. 2), pull-down circuitry (such as the pull-down circuitry 300 of FIG. 3), sensor circuitry (such as the sensor circuitry 500 of FIG. 5), or some combination thereof. The bias sources may be set to be one or more voltages selected based on operational values and/or maximum operational values for components within the circuitry to which the bias sources are provided.

The well bias circuitry 600 may include one or more transistors, such as transistors 602, 604, 606, 608, 610, 612, 614, 616 and 618. The one or more transistors may be switched between on and off states to generate the one or more bias sources.

Figure 7:
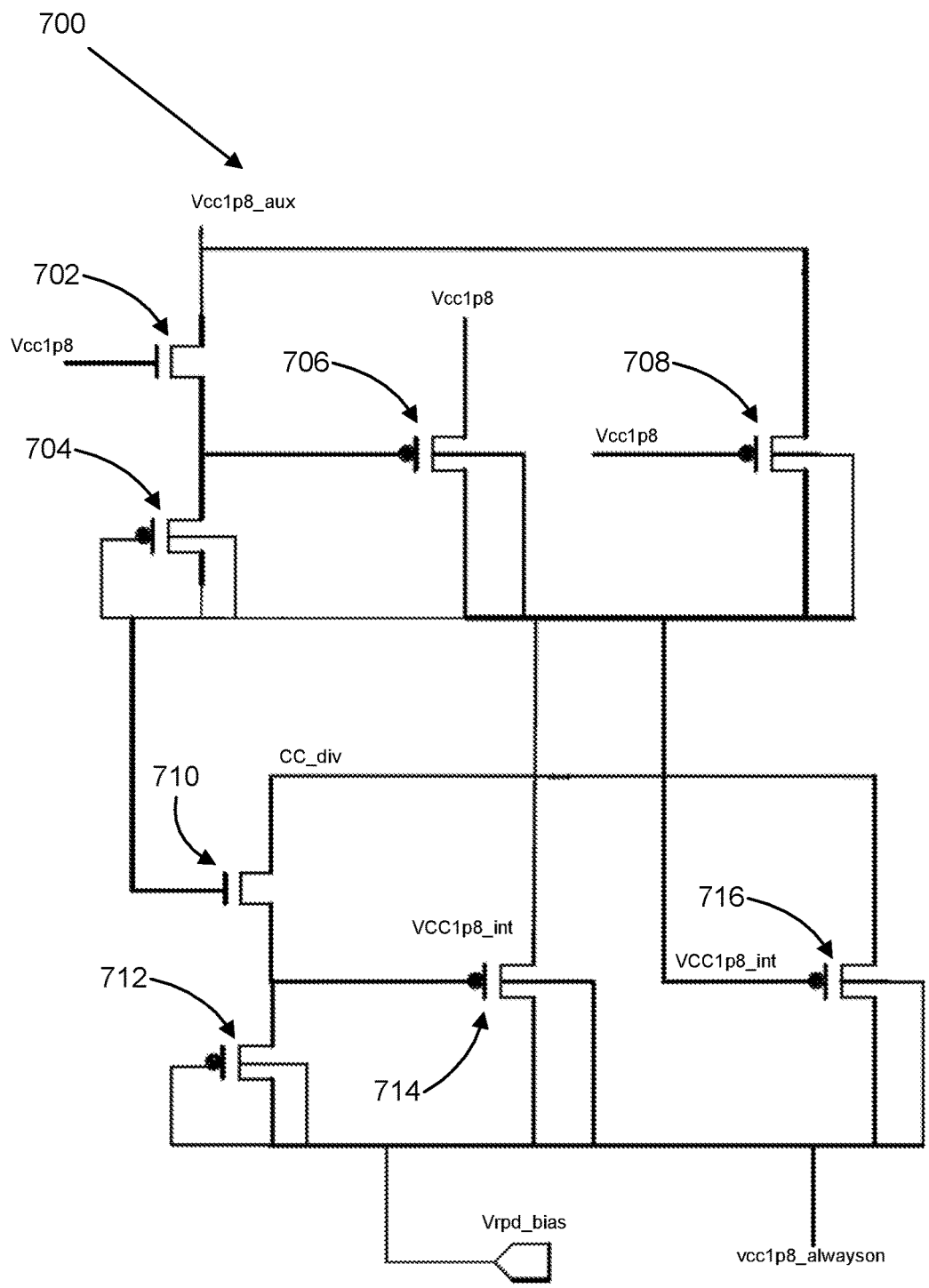
FIG. 7 illustrates an example of biasing circuitry for voltage tolerant presence detection, according to various embodiments.

FIG. 7 illustrates an example of biasing circuitry 700 for voltage tolerant presence detection, according to various embodiments. The biasing circuitry 700 may be included in self-bias circuitry, such as the self-bias circuitry 108 of FIG. 1, and may be to generate one or more bias sources from the power received from the power supply.

The biasing circuitry may be coupled to a power supply and may receive power from the power supply of a device, such as the device 102 of FIG. 1. The biasing circuitry 700 may generate one or more bias sources from the power received from the power supply. The one or more bias sources may be utilized to power one or more of the components within the self-bias circuitry. The one or more bias sources may be set to be one or more voltages selected based on operational values for components within the self-bias circuitry. In some embodiments, the biasing circuitry 700 may generate a bias source having a voltage of 1.8 volts.

The biasing circuitry 700 may include one or more transistors, such as transistors 702, 704, 706, 708, 710, 712, 714 and 716. The one or more transistors may be switched between on and off states to generate the one or more bias sources.

Figure 8:
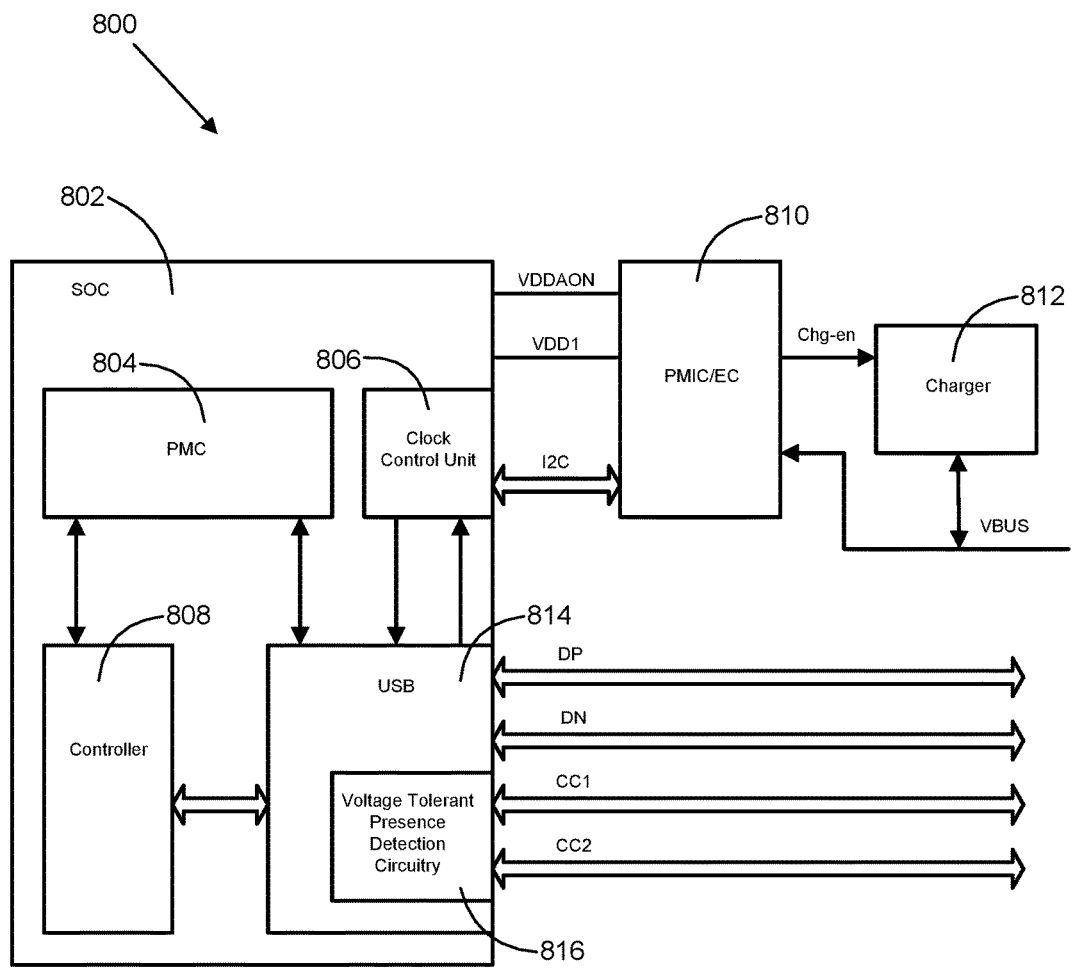
FIG. 8 illustrates an example computing system implementing a voltage tolerant presence detection system, according to various embodiments.

FIG. 8 illustrates an example computing system 800 implementing voltage tolerant presence detection circuitry 816, according to various embodiments. The computing system 800 may include a SOC 802. The SOC 802 may include a PCI mezzanine card 804, a clock control unit 806, a controller 808 and a USB interface 814. The USB interface 814 may include a voltage tolerant presence detection circuitry 816. The SOC 802 may be coupled to a power management integrated circuit with an embedded controller 810, a charger 812, or some combination thereof.

The voltage tolerant presence detection circuitry 816 may include a transceiver (such as the transceiver 106 of FIG. 1), self-bias circuitry 108 (such as the self-bias circuitry 108 of FIG. 1), termination circuitry (such as the termination circuitry 110 of FIG. 1), clamping circuitry (such as the clamping circuitry 112 of FIG. 1 and/or the clamping circuitry 400 of FIG. 4), CC detection circuitry (such as the CC detection circuitry 114 of FIG. 1), ESD circuitry (such as the ESD circuitry 116 of FIG. 1), pull-up circuitry (such as the pull-up circuitry 200 of FIG. 2), pull-down circuitry (such as the pull-down circuitry 300 of FIG. 3), sensor circuitry (such as the sensor circuitry 500 of FIG. 5), well bias circuitry (such as the well bias circuitry 600 of FIG. 6), biasing circuitry (such as the biasing circuitry 700 of FIG. 7), or some combination thereof. In some embodiments, the voltage tolerant presence detection circuitry 816 may be located on a die of the SOC 802.

Figure 9:
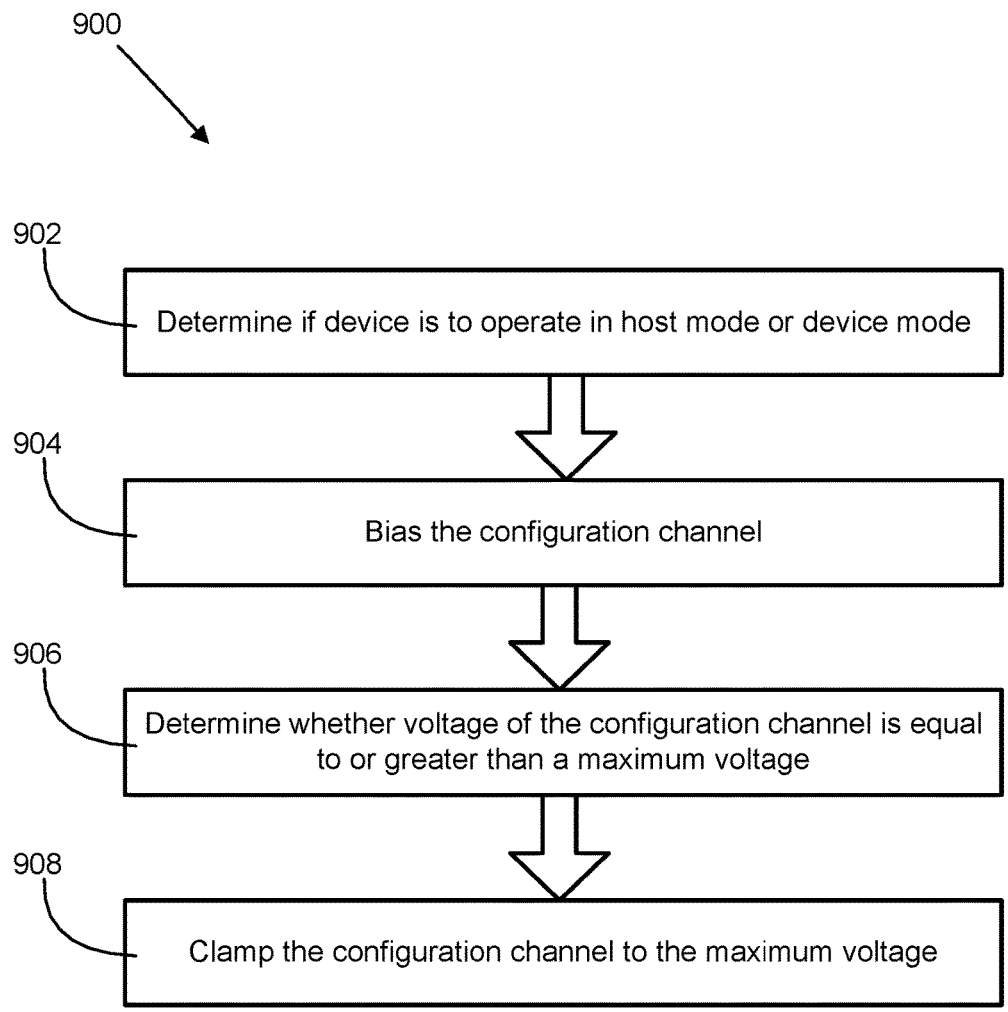
FIG. 9 illustrates an example method of implementing voltage tolerant presence detection, according to various embodiments.

FIG. 9 illustrates an example method 900 of implementing voltage tolerant presence detection, according to various embodiments. The method 900 may include block 902, where a determination of whether a device, such as the device 102 of FIG. 1, is to operate in host mode or device mode. The determination may be based on a voltage present on a CC, such as one or more of the CCs described throughout this disclosure, associated with the device. The determination may be performed by self-bias circuitry (such as the self-bias circuitry 108 of FIG. 1), sensor circuitry (such as the sensor circuitry 500 of FIG. 5), or some combination thereof, and in accordance with method of determining whether the device is to operate in host mode or device mode as described throughout this disclosure.

The method 900 may further include block 902, where the CC is biased based on the determination of whether the device is to operate in host mode or device mode. The CC may be biased at a logic level corresponding to either the host mode or the device mode. The biasing may be performed by termination circuitry (such as the termination circuitry 110 of FIG. 1), pull-up circuitry (such as the pull-up circuitry 200 of FIG. 2), pull-down circuitry (such as the pull-down circuitry 300 of FIG. 3), or some combination thereof, and in accordance with methods of biasing the CC as described throughout this disclosure.

The CC may be biased at a logic low level corresponding to the device mode in response to determination that the device is to operate in the device mode. The biasing at the logic low level may be performed by the pull-down circuitry, the termination circuitry, or some combination thereof. The logic low level may be equal to the ground of the system performing the biasing.

The CC may be biased at a logic low level corresponding to the host mode in response to determination that the device is to operate in the host mode. The biasing at the logic high level may be performed by the pull-up circuitry, the termination circuitry, or some combination thereof.

The method 900 may further include block 906, where it is determined whether the voltage of the configuration channel is equal to or greater than a maximum voltage. The determination may be performed by clamping circuitry (such as the clamping circuitry 112 of FIG. 1 and/or the clamping circuitry 400 of FIG. 4), self-bias circuitry (such as the self-bias circuitry 108 of FIG. 1), sensor circuitry (such as the sensor circuitry 500 of FIG. 5), or some combination thereof, and in accordance with any of the methods of determining whether the voltage of the configuration channel is equal to or greater than a maximum voltage as described throughout this disclosure.

The method 900 may further include block 908, where the CC is clamped to the maximum voltage. The clamping may be performed by clamping circuitry (such as the clamping circuitry 112 of FIG. 1 and/or the clamping circuitry 400 of FIG. 4), and in accordance with the methods of clamping the CC to the maximum voltage as described throughout this disclosure.

The CC may be clamped to the maximum voltage in response to the determination that the voltage present on the CC is equal to or greater than the maximum voltage. Clamping the CC may include sinking current from the CC to maintain the maximum voltage. The maximum voltage may be selected based on a maximum operation voltage of electrical components coupled to the circuitry performing the clamping and/or electrical components within the circuitry performing the clamping.

Figure 10:
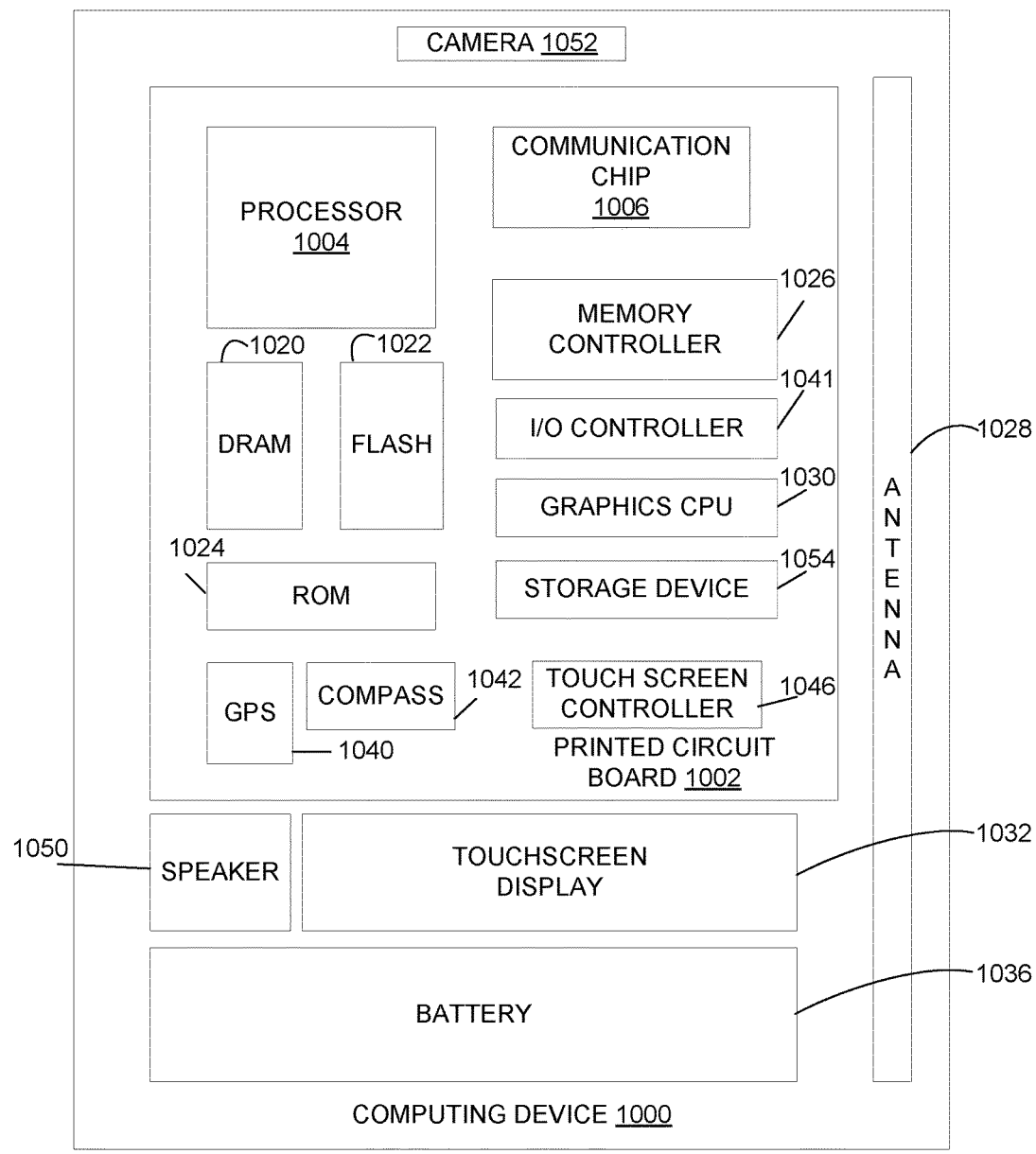
FIG. 10 illustrates an example computing device that may employ the apparatuses and/or methods described herein.

FIG. 10 illustrates an example computing device 1000 that may employ the apparatuses and/or methods described herein (e.g., the transceiver 106 of FIG. 1, the self-bias circuitry 108 of FIG. 1, the termination circuitry 110 of FIG. 1, the clamping circuitry 112 of FIG. 1, the CC detection circuitry 114 of FIG. 1, the ESD circuitry 116 of FIG. 1, the pull-up circuitry 200 of FIG. 2, the pull-down circuitry 300 of FIG. 3, the clamping circuitry 400 of FIG. 4, the sensor circuitry 500 of FIG. 5, the well bias circuitry 600 of FIG. 6, the biasing circuitry 700 of FIG. 7, the computing system 800 of FIG. 8, the method 900 of FIG. 9, or some combination thereof), in accordance with various embodiments. As shown, computing device 1000 may include a number of components, such as one or more processor(s) 1004 (one shown) and at least one communication chip 1006. In various embodiments, the one or more processor(s) 1004 each may include one or more processor cores. In various embodiments, the at least one communication chip 1006 may be physically and electrically coupled to the one or more processor(s) 1004. In further implementations, the communication chip 1006 may be part of the one or more processor(s) 1004. In various embodiments, computing device 1000 may include printed circuit board (PCB) 1002. For these embodiments, the one or more processor(s) 1004 and communication chip 1006 may be disposed thereon. In alternate embodiments, the various components may be coupled without the employment of PCB 1002.

Depending on its applications, computing device 1000 may include other components that may or may not be physically and electrically coupled to the PCB 1002. These other components include, but are not limited to, memory controller 1026, volatile memory (e.g., dynamic random access memory (DRAM) 1020), non-volatile memory such as read only memory (ROM) 1024, flash memory 1022, storage device 1054 (e.g., a hard-disk drive (HDD)), an I/O controller 1041, a digital signal processor (not shown), a crypto processor (not shown), a graphics processor 1030, one or more antenna 1028, a display (not shown), a touch screen display 1032, a touch screen controller 1046, a battery 1036, an audio codec (not shown), a video codec (not shown), a global positioning system (GPS) device 1040, a compass 1042, an accelerometer (not shown), a gyroscope (not shown), a speaker 1050, a camera 1052, and a mass storage device (such as hard disk drive, a solid state drive, compact disk (CD), digital versatile disk (DVD)) (not shown), and so forth.

In some embodiments, the one or more processor(s) 1004, flash memory 1022, and/or storage device 1054 may include associated firmware (not shown) storing programming instructions configured to enable computing device 1000, in response to execution of the programming instructions by one or more processor(s) 1004, to practice all or selected aspects of the methods described herein. In various embodiments, these aspects may additionally or alternatively be implemented using hardware separate from the one or more processor(s) 1004, flash memory 1022, or storage device 1054.

In various embodiments, one or more components of the computing device 1000 may include the transceiver 106 of FIG. 1, the self-bias circuitry 108 of FIG. 1, the termination circuitry 110 of FIG. 1, the clamping circuitry 112 of FIG. 1, the CC detection circuitry 114 of FIG. 1, the ESD circuitry 116 of FIG. 1, the pull-up circuitry 200 of FIG. 2, the pull-down circuitry 300 of FIG. 3, the clamping circuitry 400 of FIG. 4, the sensor circuitry 500 of FIG. 5, the well bias circuitry 600 of FIG. 6, the biasing circuitry 700 of FIG. 7 and/or the computing system 800 of FIG. 8 described herein.

The communication chips 1006 may enable wired and/or wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth, and a second communication chip 1006 may be dedicated to longer range wireless communications such as GPS, EDGE, GPRS, CDMA, WiMAX, LTE, Ev-DO, and others.

In various implementations, the computing device 1000 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 1000 may be any other electronic device that processes data.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

Example 1 may include an apparatus to enable voltage tolerant termination presence detection, comprising sensor circuitry to determine whether a device coupled to the sensor circuitry is to operate in a host mode or a device mode based on a signal on a configuration channel between the device and the sensor circuitry and termination circuitry to bias the configuration channel in accordance with the host mode or the device mode based on the determination of whether the device is to operate in the host mode or the device mode.

Example 2 may include the apparatus of example 1 and/or any other example herein, further comprising pull-down circuitry to set the configuration channel to a voltage associated with the device mode, wherein, in response to a determination by the sensor circuitry that the device is to operate in the device mode, the termination circuitry is to enable the pull-down circuitry to set the configuration channel to the voltage associated with the device mode.

Example 3 may include the apparatus of example 2 and/or any other example herein, wherein to set the configuration channel to the voltage associated with the device mode includes to couple the configuration channel to ground by the pull-down circuitry.

Example 4 may include the apparatus of any of the examples 1-3 and/or any other example herein, further comprising pull-up circuitry to set the configuration channel to a voltage associated with the host mode, wherein, in response to a determination by the sensor circuitry that the device is to operate in the host mode, the termination circuitry is to enable the pull-up circuitry to set the configuration channel to the voltage associated with the host mode.

Example 5 may include the apparatus of any of the examples 1-3 and/or any other example herein, wherein the sensor circuitry determines whether the device is to operate in host mode or device mode based on a voltage of the signal.

Example 6 may include the apparatus of any of the examples 1-3 and/or any other example herein, wherein the sensor circuitry is further to identify an occurrence of a maximum voltage on the configuration channel, and wherein the apparatus further comprises voltage clamping circuitry to limit voltage of the configuration channel to the maximum voltage in response to the occurrence of the maximum voltage.

Example 7 may include the apparatus of example 6 and/or any other example herein, wherein the maximum voltage is selected based on a maximum operational voltage of electrical components within the apparatus.

Example 8 may include the apparatus of example 6 and/or any other example herein, wherein the clamping circuitry includes circuitry to sink current from the configuration channel in response to identification of the occurrence of the maximum voltage on the configuration channel.

Example 9 may include the apparatus of any of the examples 1-3 and/or any other example herein, wherein the apparatus is located within a system on chip.

Example 10 may include the apparatus of any of the examples 1-3 and/or any other example herein, wherein the apparatus is located on a die.

Example 11 may include a system for termination presence detection, comprising a die, sensor circuitry, located on the die, to determine whether a device coupled to the sensor circuitry is in a low power condition based on a signal on a configuration channel between the device and the sensor circuitry, and termination circuitry, located on the die, to bias the configuration channel based on the determination of whether the device is in the low power condition.

Example 12 may include the system of examples 11 and/or any other example herein, further comprising pull-down circuitry, located on the die, to couple the configuration channel to ground in response to determination, by the sensor circuitry, that the device is in the low power condition.

Example 13 may include the system of examples 11 and/or any other example herein, further comprising pull-up circuitry, located on the die, to set the configuration channel to a logic high level in response to determination, by the sensor circuitry, that the device is not in the low power condition.

Example 14 may include the system of any of the examples 11-13 and/or any other example herein, wherein the sensor circuitry is further to identify an occurrence of a maximum voltage on the configuration channel, and wherein the system further comprises voltage clamping circuitry, located on the die, to limit voltage of the configuration channel to the maximum voltage in response to the occurrence of the maximum voltage.

Example 15 may include the system of example 14 and/or any other example herein, wherein the maximum voltage is selected based on a maximum operational voltage of electrical components with the system.

Example 16 may include the system of example 14 and/or any other example herein, wherein the clamping circuitry includes circuitry to sink current from the configuration channel in response to identification of the occurrence of the maximum voltage on the configuration channel.

Example 17 may include the system of any of the examples 11-13 and/or any other example herein, wherein the system further comprises a system on chip, wherein the die is located within the system on chip.

Example 18 may include a method of voltage tolerant termination presence detection, comprising determining, by sensor circuitry, whether a device coupled to the sensor circuitry is to operate in a host mode or a device mode based on a voltage present on a configuration channel associated with the device and biasing, by termination circuitry coupled with the sensor circuitry, the configuration channel at a logic level corresponding to either the host mode or the device mode based on the determination of whether the device is to operate in the host mode or the device mode.

Example 19 may include the method of example 18 and/or any other example herein, wherein biasing the configuration channel at the logic level includes biasing, by pull-down circuitry of the termination circuitry, the configuration channel at a logic low level corresponding to the device mode in response to determination, by the sensor circuitry, that the device is to operate in the device mode.

Example 20 may include the method of example 18 and/or any other example herein, wherein biasing the configuration channel at the logic level includes biasing, by pull-up circuitry of the termination circuitry, the configuration channel at a logic high level corresponding to the host mode in response to determination, by the sensor circuitry, that the device is to operate in the host mode.

Example 21 may include the method of any of the examples 18-20 and/or any other example herein, further comprising determining, by the sensor circuitry, that the voltage present on the configuration channel is equal to or greater than a maximum voltage and clamping, by clamping circuitry coupled to the sensor circuitry, the configuration channel to the maximum voltage in response to determination that the voltage present on the configuration channel is equal to or greater than the maximum voltage.

Example 22 may include the method of example 21 and/or any other example herein, wherein the maximum voltage is selected based on a maximum operational voltage of electrical components performing the method.

Example 23 may include the method of example 21 and/or any other example herein, wherein clamping the configuration channel to the maximum voltage includes sinking current from the configuration channel.

Example 24 may include an apparatus for voltage tolerant termination presence detection, comprising means for determining whether a device is to operate in a host mode or a device mode based on a voltage present on a configuration channel associated with the device and means for biasing the configuration channel at a voltage corresponding to either the host mode or the device mode based on the determination of whether the device is to operate in the host mode or the device mode.

Example 25 may include the apparatus of example 24 and/or any other example herein, wherein the means for biasing the configuration channel at the voltage corresponding to either the host mode or the device mode includes means for biasing the configuration channel at a voltage corresponding to the device mode in response to a determination, by the means for determining, that the device is to operate in the device mode.

Example 26 may include the apparatus of example 24 and/or any other example herein, wherein the means for biasing the configuration channel at the voltage corresponding to either the host mode or the device mode includes means for biasing the configuration channel at a voltage corresponding to the host mode in response to a determination, by the means for determining, that the device is to operate in the host mode.

Example 27 may include the apparatus of any of the examples 24-26 and/or any other example herein, further comprising means for determining that the voltage present on the configuration channel is equal to or greater than a maximum voltage and means for clamping the configuration channel to the maximum voltage in response to determination that the voltage present on the configuration channel is equal to or greater than the maximum voltage.

Example 28 may include the apparatus of example 27 and/or any other example herein, wherein the maximum voltage is selected based on a maximum operational voltage of electrical components of the apparatus.

Example 29 may include the apparatus of example 27 and/or any other example herein, wherein the means for clamping the configuration channel to the maximum voltage includes means for sinking current from the configuration channel.

Example 30 may include the apparatus of any of the examples 24-26 and/or any other example herein, wherein the apparatus is located within a system on chip.

Example 31 may include the apparatus of any of the examples 24-26 and/or any other example herein, wherein the apparatus is located on a die.

What is claimed is:

1. An apparatus for voltage tolerant termination presence detection, comprising:
   detection circuitry coupled to a configuration channel, the detection circuitry to determine whether a device coupled to the configuration channel is to operate in a device mode; and
   termination circuitry coupled to the detection circuitry and the configuration channel, wherein the termination circuitry is to set the configuration channel to a logic level low in response to determination that the device is to operate in the device mode.

2. The apparatus of claim 1, wherein the termination circuitry includes pull-down circuitry coupled to the configuration channel, wherein the pull-down circuitry is utilized to set the configuration channel to the logic level low.

3. The apparatus of claim 2, wherein the pull-down circuitry includes one or more resistors coupled to the configuration channel, wherein the one or more resistors are activated to set the configuration channel to the logic level low.

4. The apparatus of claim 3, wherein the pull-down circuitry further includes one or more transistors coupled to the one or more resistors, wherein the one or more transistors control activation of the one or more resistors to set the configuration channel to the logic level low.

5. The apparatus of claim 4, wherein the pull-down circuitry further includes an OR logical construct coupled to each gate of the one or more transistors, wherein the OR logical construct is to receive a signal that indicates the device is to operate in the device mode and cause the one or more transistors to activate the one or more resistors based on the signal.

6. The apparatus of claim 2, wherein the detection circuitry is further to determine whether the device is to operate in a host mode, wherein the pull-down circuitry includes a transistor that disables the pull-down circuitry from setting the configuration channel to the logic level low in response to determination that the device is to operate in the host mode.

7. The apparatus of claim 6, wherein the pull-down circuitry further includes an AND logical construct coupled to a gate of the transistor, wherein the AND logical construct is to receive a signal that indicates that the device is to operate in the host mode and cause the transistor to disable the pull-down circuitry based on the signal.

8. The apparatus of claim 1, further comprising clamping circuitry to limit voltage of the configuration channel to below a maximum voltage.

9. The apparatus of claim 8, wherein the clamping circuitry includes a resistor to sink current from the configuration channel to maintain the voltage of the configuration channel below the maximum voltage.

10. The apparatus of claim 1, wherein the apparatus is located within a system on chip.

11. A system for voltage tolerant termination presence detection, comprising:
    a printed circuit board (PCB);
    a die mounted to the PCB;
    a USB connector mounted to the PCB, the USB connector to couple a device to the die via a configuration channel;
    detection circuitry located on the die and coupled to the configuration channel, the detection circuitry to determine whether the device coupled to the configuration channel is to operate in a device mode; and termination circuitry located on the die and coupled to the detection circuitry and the configuration channel, wherein the termination circuitry is to set the configuration channel to a logic level low in response to determination that the device is to operate in the device mode.

12. The system of claim 11, further comprising clamping circuitry located on the die and coupled to the configuration channel, the clamping circuitry to limit voltage of the configuration channel to below a maximum voltage.

13. The system of claim 12, wherein the clamping circuitry includes a resistor to sink current from the configuration channel to maintain the voltage of the configuration channel below the maximum voltage.

14. The system of claim 11, wherein the termination circuitry includes pull-down circuitry coupled to the configuration channel, wherein the pull-down circuitry is utilized to set the configuration channel to the logic level low.

15. The system of claim 11, wherein the pull-down circuitry includes one or more resistors coupled to the configuration channel, wherein the one or more resistors are activated to set the configuration channel to the logic level low.

16. The system of claim 15, wherein the pull-down circuitry further includes one or more transistors coupled to the one or more resistors, wherein the one or more transistors control activation of the one or more resistors to set the configuration channel to the logic level low.

17. An apparatus for voltage tolerant termination presence detection, comprising:

means for determining whether a device coupled to a configuration channel is to operate in a device mode;

means for setting the configuration channel to a logic level low in response to determination that the device is to operate in the device mode.

18. The apparatus of claim 17, wherein the means for setting the configuration channel includes means for controlling activation of one or more resistors of the means for setting the configuration channel to set the configuration channel to the logic level low.

19. The apparatus of claim 17, further comprising means for limiting voltage of the configuration channel to below a maximum voltage.

20. The apparatus of claim 19, wherein the means for limiting the voltage includes means for causing a resistor of the means for limiting the voltage to sink current from the configuration channel to maintain the voltage of the configuration channel below the maximum voltage.

* * * * *